(12) United States Patent
Heim et al.

(10) Patent No.: US 10,135,424 B2
(45) Date of Patent: Nov. 20, 2018

(54) DIGITAL FILTER WITH CONFIDENCE INPUT

(71) Applicant: MICROCHIP TECHNOLOGY GERMANY GMBH, Rosenheim (DE)

(72) Inventors: Axel Heim, Munich (DE); Martin Hoch, Gilching (DE)

(73) Assignee: MICROCHIP TECHNOLOGY GERMANY GMBH, Rosenheim (DE)

( * ) Notice: Subject to any disclaimer, the term of this patent is extended or adjusted under 35 U.S.C. 154(b) by 0 days.

(21) Appl. No.: 15/053,722

(22) Filed: Feb. 25, 2016

(65) Prior Publication Data

US 2016/0261250 A1 Sep. 8, 2016

Related U.S. Application Data

(60) Provisional application No. 62/121,953, filed on Feb. 27, 2015, provisional application No. 62/127,011, filed on Mar. 2, 2015.

(51) Int. Cl.
*H03H 17/06* (2006.01)
*G06F 17/18* (2006.01)

(52) U.S. Cl.
CPC ............ *H03H 17/06* (2013.01); *G06F 17/18* (2013.01)

(58) Field of Classification Search
CPC .............. H03H 17/06; H03H 17/0027; H03H 17/0227; H03H 2017/0081; H03H 2017/0072; H03H 21/00–21/0067
USPC .......................... 708/300–323; 345/156–187; 382/254–275
See application file for complete search history.

(56) References Cited

U.S. PATENT DOCUMENTS

| | | | |
|---|---|---|---|
| 5,231,680 A * | 7/1993 | Williams | H04N 5/945 348/615 |
| 6,175,591 B1 | 1/2001 | Iwamatsu | 375/232 |
| 6,856,703 B1 | 2/2005 | Gobert | 382/260 |
| 8,671,128 B1 | 3/2014 | Dehghan et al. | 708/323 |
| 8,885,890 B2 * | 11/2014 | Tardif | G06T 5/002 382/106 |
| 2011/0274366 A1 | 11/2011 | Tardif | 382/260 |
| 2012/0226728 A1 * | 9/2012 | Knee | H03H 21/0012 708/301 |

FOREIGN PATENT DOCUMENTS

EP 2851867 A2 3/2015 ............ G06T 5/20

OTHER PUBLICATIONS

Smith, Steven W. ("The Scientist and Engineer's Guide to Digital Signal Processing Second Edition" published by California Technical Publishing, on 1997 ISBN: 0-9660176-6-8).*
Sinclair, Ian ("Electronics Simplified, 3rd Edition" published by Newnes, on Apr. 13, 2011, ISBN: 978-0-08-097063-9).*
(Continued)

*Primary Examiner* — Michael D. Yaary
(74) *Attorney, Agent, or Firm* — Slayden Grubert Beard PLLC

(57) ABSTRACT

A finite impulse response (FIR) digital filter has an assigned filter function with assigned filter coefficients, an input receiving input samples, another input receiving confidence information values, and an output. Each input sample value is associated to an input confidence value and the filter output depends on both the input samples and the input confidence values.

36 Claims, 11 Drawing Sheets

(56) References Cited

OTHER PUBLICATIONS

Kastner, Daniel ("Embedded DSP: Introduction to Digital Filters" published in 2002, URL: http://www.rw.cdl.uni-saarland.de/~kaestner/es0203/lecthr05.pdf).*

International Search Report and Written Opinion, Application No. PCT/EP2016/054181, 15 pages, dated May 20, 2016.

Grubbs, F. E., "Sample Criteria for Testing Outlying Observations," Annals of Mathematical Statistics, pp. 27-58, Mar. 1950.

Kalman, R. E., "A New Approach to Linear Filtering and Prediction Problems," Transactions of the ASME-Journal of Basic Engineering, 12 pages, 1960.

Hampel, F. R., "The Influence Curve and its Role in Robust Estimation," Journal of the American Statistical Association, vol. 69, No. 46, pp. 383-393, 1974.

Blahut, R. E., *Theory and Practice of Error Control Codes*, Entire Book, AddisonWesley, Book Review, 2 pages, 1983.

Lee, J.-S., "Digital image smoothing and the sigma filter," Computer Vision, Graphics, and Image Processing, pp. 165-168, 1983.

Ko, S.J. et al., "Center Weighted Median Filters and Their Applications to Image Enhancement," IEEE Transactions on Circuits and Systems, vol. 38, No. 9, pp. 984-993, 1991.

Hwang, H. et al., "Adaptive Median Filters: New Algorithms and Results," IEEE Transactions on Image Processing, vol. 4, No. 4, pp. 499-502, 1995.

Bossert, M., *Channel Coding for Telecommunication*, Entire Book, New York, NY, USA: John Wiley & Sons, Inc., Book Abstract, 2 pages, 1999.

Boashash, Boualem et al., Signal Enhancement by Time-Frequency Peak Filtering. IEEE Transactions on Signals Processing, vol. 52, No. 4, pp. 929-937 (9 pages), Apr. 2004.

Bohn, Bruce, "AN1250: Micrcohip CTMU for Capacitive Touch Applications," Microchip Technology Incorporated, 22 pages, Jan. 16, 2009.

Aiswarya, K., "A New and Efficient Algorithm for the Removal of High Density Salt and Pepper Noise in Images and Videos," Second International Conference on Computer Modeling and Simulation, pp. 409-413, 2010.

Davison, Burke, "AN1478: mTouch™ Sensing Solution Acquisition Methods Capacitive Voltage Divider," Microchip Technology Incorporated, 28 pages, Oct. 26, 2012.

Benazir, T. et al., "Removal of High and Low Density Impulse Noise from Digital Images Using Non Linear Filter," International Conference on Signal Processing, Image Processing and Pattern Recognition, 7 pages, 2013.

Horentrup, J. et al., "Confidence-aware guided image filter," IEEE International Conference on Image Processing, pp. 3243-3247, 2014.

"MGC3030/3130: 3D Tracking and Gesture Controller Data Sheet," Microchip Techology Incorporated, 50 pages, Mar. 25, 2014.

"Microchip Touch and Input Sensing Solutions," Retrieved from http://www.microchip.com/touchandinputsensing, 2 pages, Retrieved on Mar. 14, 2016.

Commission I.E. "IEC 61000-4-4: Electrical Fast Transient/Burst Immunity Test," 3 pages, Retrieved on Mar. 14, 2016.

Yue, Qi et al., "Low-Power FIR Filter Based on Standard Cell," 6th International Conference on ASIC, Shanghai, China, IEEE, vol. 1, pp. 251-254, Oct. 24, 2005.

International Search Report and Written Opinion, Application No. PCT/EP2017/068172, 17 pages, dated Nov. 16, 2017.

U.S. Non-Final Office Action, U.S. Appl. No. 15/215,930, 18 pages, dated Jun. 7, 2018.

* cited by examiner

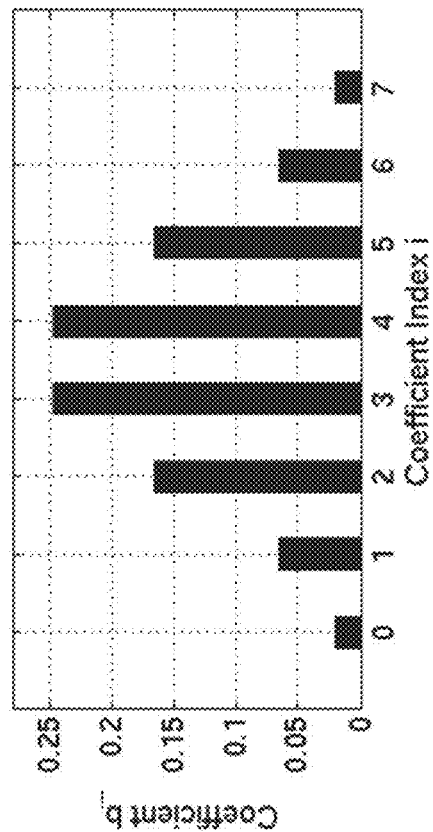
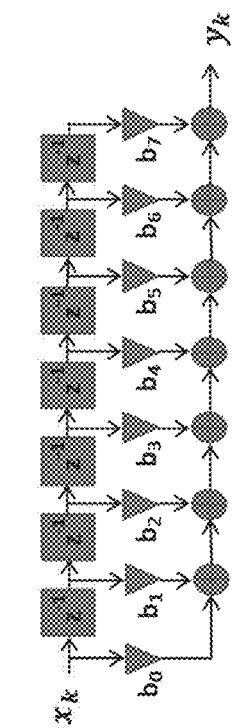
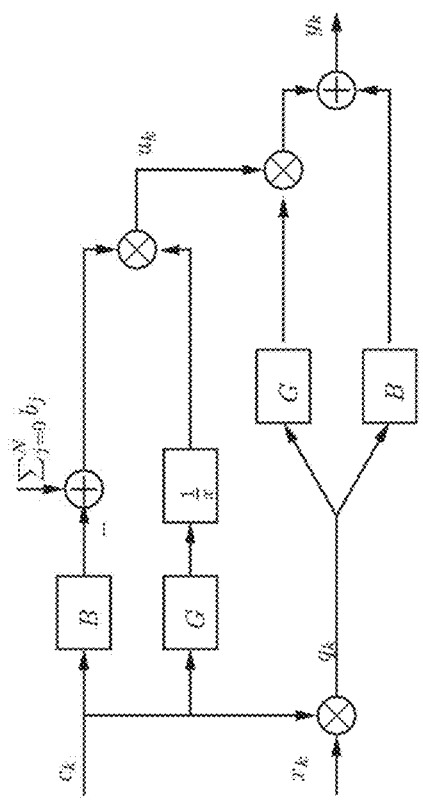
*Figure 2*
(Prior Art)
*Figure 4*

DIGITAL FILTER WITH CONFIDENCE INPUT

CROSS-REFERENCE TO RELATED APPLICATIONS

This application claims priority to commonly owned U.S. Provisional Patent Application No. 62/121,953 filed Feb. 27, 2015 and U.S. Provisional Patent Application No. 62/127, 011 filed Mar. 2, 2015; all of which are hereby incorporated by reference herein for all purposes.

TECHNICAL FIELD

The present disclosure relates to digital filters, in particular digital filters for noise suppression.

BACKGROUND

To sense analog signals for processing in digital devices, sampling a signal (significantly) faster than its actual information content changes is a common practice that allows the enhancement of the digitized signal, exploiting the information's redundancy. Examples for such devices include capacitive-touch sensing or touchless position and gesture sensing systems, digital voltmeters, thermometers or pressure sensors.

Exemplary capacitive sensing systems which can be subject to significant noise include the systems described in application note AN1478, "mTouch™ Sensing Solution Acquisition Methods Capacitive Voltage Divider", and AN1250, "Microchip CTMU for Capacitive Touch Applications", both available from Microchip Technology Inc., the Assignee of the present application, and hereby incorporated by reference in their entirety.

Another exemplary application is a touchless capacitive 3D gesture system—also known as the GestIC® Technology—manufactured by the Assignee of the present application.

The sensor signals are typically subject to disturbance by various noise types, such as broadband noise, harmonic noise, and peak-noise. The latter two can arise, for example, from switching power supplies, and are also addressed in electro-magnetic immunity standard tests, e.g. IEC 61000-4-4.

The signal acquisition can also be interrupted in a scheduled or deterministic scheme; e.g., when multiplexing several sensors in time, or by irregular events such as data transmission failures. Such discontinuities or missing samples can cause undesired phase jumps in the signal. With digital filters designed for regular sampling intervals, this will corrupt the filter timing and can severely affect their noise-suppression performance.

In analogy to erased messages in the context of channel coding in digital communications (Blahut, 1983; Bossert, 1999) we refer to missing samples and samples that do not carry useful information—e.g., due to peak noise—as Erasures.

FIG. 1a shows a system 100 performing a basic procedure for estimating a noisy, real-valued baseband signal. The Analog-to-Digital Converter (ADC) 110 samples the signal at a rate (significantly) higher than its information changes. The digital signal is then input to a low-pass filter 120 and decimated with rate R by decimator 130. The downsampled result is processed further or is simply displayed, e.g. on a numeric display 140 as shown in FIG. 1a. Therein, the low-pass filter 120 is able to attenuate the higher frequency components of broadband noise, but will not thoroughly suppress noise peaks.

The problem of peak-noise suppression occurs in many applications, such as image processing (T. Benazir, 2013), seismology, and medical (B. Boashash, 2004). A standard approach for fighting peak noise is to apply a Median Filter or variants.

An approach to suppress peak-noise, but still smoothing the input signal, is a filter that averages over a subset of samples in a time window, excluding samples that have been identified as noise peaks or outliers, or excluding, for example, the n largest and the n smallest samples (Selective Arithmetic Mean (SAM) Filter or 'Sigma Filter' (Lee, 1983)). Clearly the SAM filter is a time-varying filter with a Finite Impulse Response (FIR) that adapts to the time-domain characteristics of its input signal.

However, while superior in the presence of noise peaks (i.e. with Erasures), without peaks the noise-suppression characteristics of such a SAM averaging filter is inferior to other state-of-the-art filters that, for example, use a Hamming window as impulse response, or filters whose frequency response is designed using the Least Squares method, as shown in FIG. 1b for a window length of 32 samples. In terms of the filters' magnitude responses, the solid curve of the Least-Squares filter and the dashed curve of the Hamming filter show improved side-lobe attenuation, compared to an averaging filter with rectangular impulse response (dash-dotted curve).

SUMMARY

There exists a need for an improved method and system of processing signals that are subject to noise. The present application is not restricted to any of the above described sensor systems but may be applied to any type of signal that is subject to noise and requires evaluation.

According to an embodiment, a finite impulse response (FIR) digital filter may comprise an assigned filter function with assigned filter coefficients, an input receiving input samples, another input receiving confidence information values, and an output, wherein each input sample value is associated to an input confidence value and the filter output may depend on both the input samples and the input confidence values.

According to a further embodiment, the assigned filter function can be a low-pass filter function. According to a further embodiment, the low-pass may be obtained from transforming a high-pass or band-pass to an equivalent low-pass domain. According to a further embodiment, the FIR filter may comprise means for buffering the input samples or the confidence-weighted input samples, and the associated confidence values. According to a further embodiment, the filter may comprise a buffer for the input samples or the confidence-weighted input samples, and a buffer for the associated confidence values. According to a further embodiment, the filter coefficient weights can be modified or eliminated depending on the confidence values associated to their corresponding input samples, wherein an aggregated removed weight of the modified or eliminated filter coefficient weights is redistributed onto at least some of the remaining filter weights. According to a further embodiment, the aggregated removed weight can be redistributed onto all of the remaining filter weights. According to a further embodiment, a signal to be sampled may comprise modulated values and wherein the signal or sampled values of the signal are demodulated before being received by the FIR filter. According to a further embodiment, the modulated values may comprise at least two groups of values and wherein a partial aggregated removed weight associated with one group is only redistributed onto remaining filter weights associated with the same group. According to a further embodiment, a redistribution can be performed by redistributing even shares of the aggregated removed weight over the at least some of the remaining filter weights. According to a further embodiment, the aggregated removed weight is distributed onto the modified filter coefficients such that the aggregated removed weight scaled by a g-weighted relative confidence associated to its corresponding input sample is added to each modified filter coefficient. According to a further embodiment, the g-weighted relative confidence can be the relative confidence. According to a further embodiment, an output confidence value can be provided. According to a further embodiment, the assigned filter function may have only positive valued coefficients or only negative valued coefficients. According to a further embodiment, the assigned filter function may have at least one non-zero valued coefficient with a different magnitude than another non-zero coefficients. According to a further embodiment, an input sample associated with Zero-valued confidence input does not contribute to the filter output value. According to a further embodiment, reducing a confidence input reduces the contribution of the associated input sample to the filter output. According to a further embodiment, reducing a confidence input may reduce the contribution of the associated input sample to the filter output and may increase the contribution of one or more of the other input samples to the filter output value. According to a further embodiment, the rate of calculating the filter output value can be higher than the input rate divided by the length of the assigned filter. According to a further embodiment, a FIR digital filter's DC gain can be constant or approximately constant. According to a further embodiment, the confidence information can be binary. According to a further embodiment, the FIR digital filter can be configured to determine whether at each discrete time step a filter weight assigned to an input sample associated with the value of the binary confidence information are set to zero, and the sum of these weights before being set to zero is distributed onto the remaining set of coefficients. According to a further embodiment, the sum can be distributed approximately evenly onto the remaining coefficients. According to a further embodiment, the sum can be distributed onto the remaining coefficients by approximately multiplying each remaining filter coefficients with the sum of the original filter coefficients divided by the sum. According to a further embodiment, the confidence information may be non-binary. According to a further embodiment, larger value of confidence information means higher confidence into the associated input value or larger value means lower confidence into the associated input value. According to a further embodiment, the filter output may depend on linearly transformed confidence input values being filtered with assigned filter function. According to a further embodiment, its buffer for the confidence values can be initialized with Zero confidence. According to a further embodiment, the tapped delay line for input data or confidence-weighted input data and the tapped delay line for confidence values can be at least approximately identical. According to a further embodiment, the FIR filter may further comprise: a first branch having a first tapped delay line receiving the input confidence values and generating a first and second output value using first and second coefficients, wherein the first output value is generated by subtracting a first coefficient weighted output sum of the first tapped delay line from a sum of the first coefficients and the second output value is generated by computing the multiplicative inverse of a second coefficient weighted output sum, wherein first and second output values are multiplied to form a first branch output value; a second branch having a second tapped delay line receiving the sample values multiplied by associated confidence values and generating a third and fourth output value using third and fourth coefficients, wherein the third output value is generated by multiplying a third coefficient weighted output sum of the second tapped delay line with the first branch output value, and wherein filter output values are generated by adding the third and fourth output values. According to a further embodiment, the first and third coefficients can be identical and wherein the second and fourth coefficients are identical. According to a further embodiment, all coefficients of the set of second coefficients and of the set of fourth coefficients may have the same value.

BRIEF DESCRIPTION OF THE DRAWINGS

FIG. 2 shows typical tap weights of a low pass filter with finite impulse response;

FIG. 4, shows an exemplary implementation of a digital filter with confidence input;

DETAILED DESCRIPTION

Figure 11:
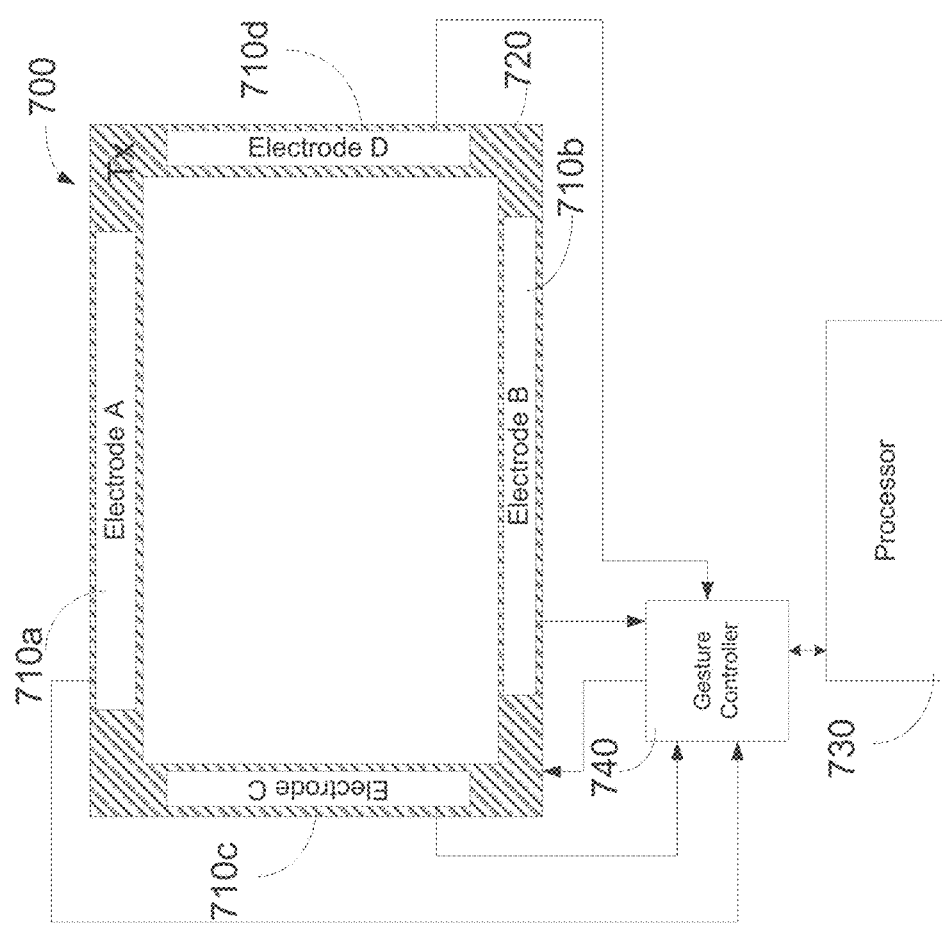
FIG. 11 shows an embodiment of a non-touching gesture detection system using an alternating quasi-static electric field.

According to various embodiments, a reliable estimate of a real-valued baseband signal, e.g. a demodulated and down-sampled GestIC® signal, can be obtained where the input signal is oversampled and noisy. GestIC® devices, such as MGC3030 or MGC3130 or newer designs are available from the Assignee of the present application. For example, FIG. 11 shows a typical embodiment, wherein controller 740 represents the GestIC® device. A general description and design guide such as the "GestIC® Design Guide" published online Jan. 15, 2015 is available from Microchip Technology Inc. and hereby incorporated by reference.

The 3D-gesture detection system 700 shown in FIG. 11 provides for a transmission electrode 720 which may be formed by a frame structure as shown in FIG. 11 and a plurality of receiving electrodes 710a . . . d. However, the entire rectangular area under the receiving electrodes 710a . . . d may be used as a transmission electrode or such an electrode can also be split into a plurality of transmission electrodes. The transmission electrode(s) 720 generate an alternating electrical field. A gesture controller 740 receives signals from the receiving electrodes 710a . . . d which may represent the capacitances between the receive electrodes 710a . . . d and system ground and/or the transmission electrode 720. The gesture controller 740 may evaluate the signals and provide a processing system 730 with human device input information. This information may be 3D moving coordinates similar to the 2-D moving information generated by a computer mouse and/or include commands that are generated from detected gestures.

The problem that was faced in such an application was that the noise that is introduced to the sensor signals is both broad-band and peak-noise, for which no state-of-the-art approach was known to address both issues simultaneously. Also, in a GestIC® application as well as other applications it is possible that some samples of the input signal are lost or cannot be generated for various reasons. While the negative impact of input noise is obvious, irregularities in the input sampling intervals lead to corruption of the filter timing and severely affect the noise suppression performance. Digital filters are typically designed for regular sampling intervals, and anything other than that leads—from the filter's point of view—to undesired phase jumps in the input signal. The position of noise peaks and missing samples in the signal is determined by some other means, e.g. a peak-noise detection system, or a deterministic noise indicator. As mentioned above, there is a standard approach for fighting broad-band noise, namely applying a frequency (low pass) filter. And there is another standard approach for fighting peak noise, namely applying a median filter over a window of signal samples.

While such problems are particularly relevant in a GestIC® system, as mentioned above, these scenarios may not only apply to GestIC® systems, but may also be relevant to other sensor systems. Hence, the proposed measures may apply to various signal sources.

For the proposed filtering method, each input sample is associated with a confidence value. This confidence value is indicating whether the associated sample is an Erasure or not—i.e., whether or not it is an actually missing sample or a sample that is known to not carry useful information. The confidence values are assumed to be known by some other means. Such means can include, for example, deterministic input, or Outlier Detection methods such as the Grubbs' Test (Grubbs, 1950), the Generalized Extreme Studentized Deviate (GESD) test, or the Hampel identifier (Hampel, 1974). In the context of image processing, confidence values are used—for example—as weights in a Least Squares regression for improved alpha matting (J. Horentrup, 2014).

According to various embodiments, the following should be observed in order to both suppress broad-band noise and to ignore undesired, e.g. noisy or missing, samples—for which no state-of-the-art approach was known to address both issues simultaneously:
1. Erasures (e.g. detected noise peaks) must not contribute to the filter output;
2. Constant filter gain should be provided at DC (For a constant input signal, the filter output signal level must be constant, too);
3. Gradual adaptation to the number of Erasures should be provided, while preserving the default filter characteristics when there are no Erasures FIG. 2 shows the filter coefficients of a typical low-pass filter—or 'windowing'—function, here exemplary a normalized Hamming window of length 8. Each filter coefficient defines the weight of its associated tap in a tapped delay line implementation, also shown in FIG. 2, where each tap is aligned underneath its associated coefficient in the bar plot. Therefore, we use the terms 'filter coefficient' and 'tap weight' synonymously. In this example, the tapped delay line contains 7 consecutive delay stages $z^{-1}$ and 8 tap weights. Exemplary input samples are also shown in FIG. 2. Other sample structures may apply with less or more stages.

According to various embodiments, given a filter function and an input signal with confidence information for each sample, the weight of the filter taps corresponding to input samples with less confidence is reduced while maintaining the filter's DC gain. FIG. 2 shows a typical weight/coefficient distribution of a low pass filter which in this example is formed by, e.g., seven consecutive delay stages $z^{-1}$. Other sample structures may apply with less or more stages.

In the following input samples that do not carry any useful information and, equivalently, missing samples can be considered as Erasures, and corresponding samples are said to have Zero confidence. The information whether a sample is erased or not is assumed to be known from any other source or algorithm, e.g. by comparing samples to a threshold. The respective digital filter's impulse response will be referred to as 'filter function'.

Figure 1A:
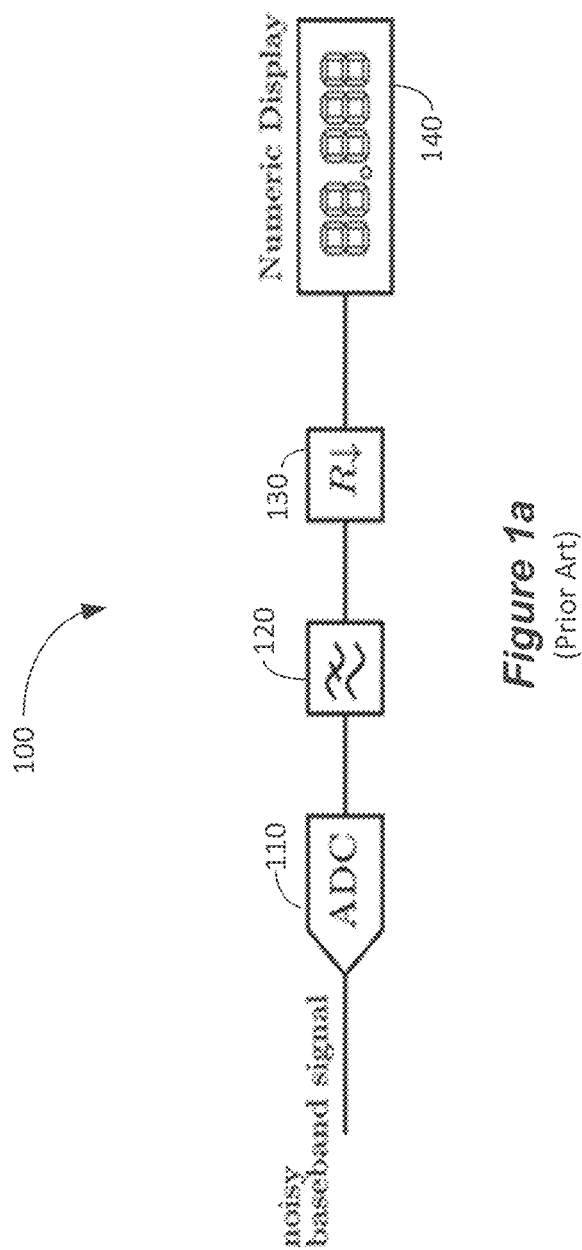
FIG. 1a shows exemplary acquisition of an analog signal, with analog-to-digital conversion and conventional noise suppression.
Figure 1B:
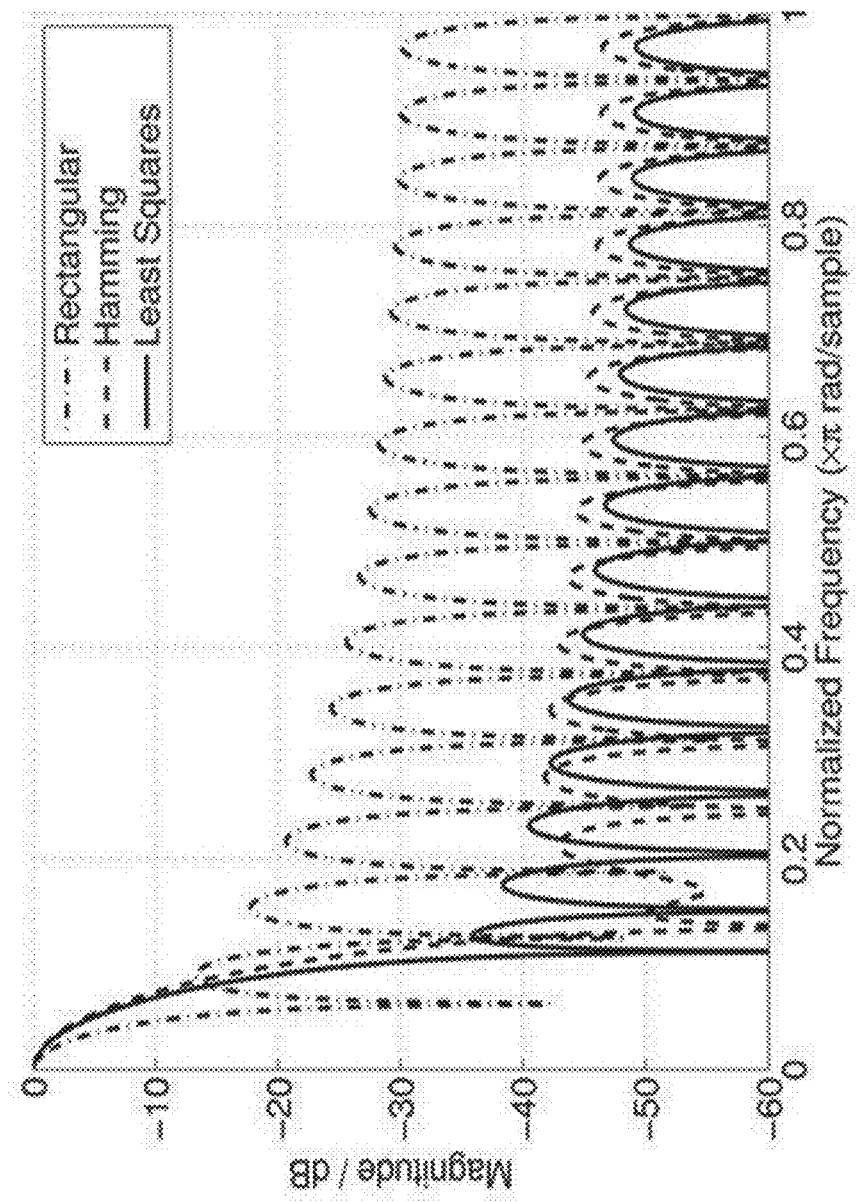
FIG. 1b shows magnitude responses of different low-pass filters.
Figure 3:
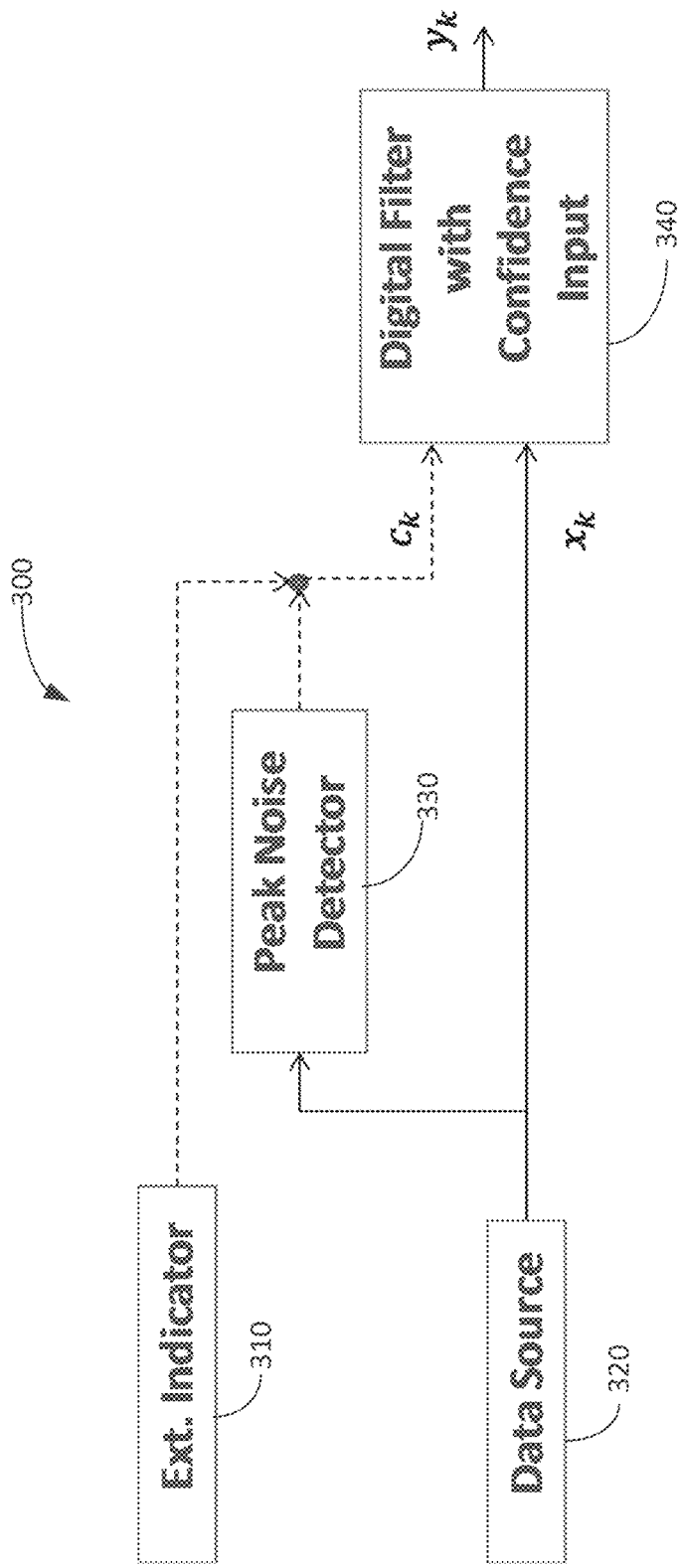
FIG. 3 shows an exemplary block diagram of a data source and associated confidence generation as an input source for a digital filter.

FIG. 3 shows a block diagram of an exemplary Digital Filter with Confidence Input 300 and its input signal sources. The Data Source 320 is generating the signal x with samples $x_k$ at discrete time k. The signal x is input to a peak noise (or 'outlier') detector 330 which classifies each sample $x_k$ into 'not noisy' or 'noisy' by associating a confidence value $c_k$ to $x_k$, where for example $c_k=1$ means 'not noisy' or 'full confidence in $x_k$', and $c_k=0$ means 'noisy' or 'No confidence in $x_k$'. That is, a sample $x_k$ with associated $c_k=0$ is an Erasure. According to other embodiments, the confidence information can also origin from some external means which we refer to as External Indicator 310. This external indication can be seen as a deterministic confidence input.

Figure 5:
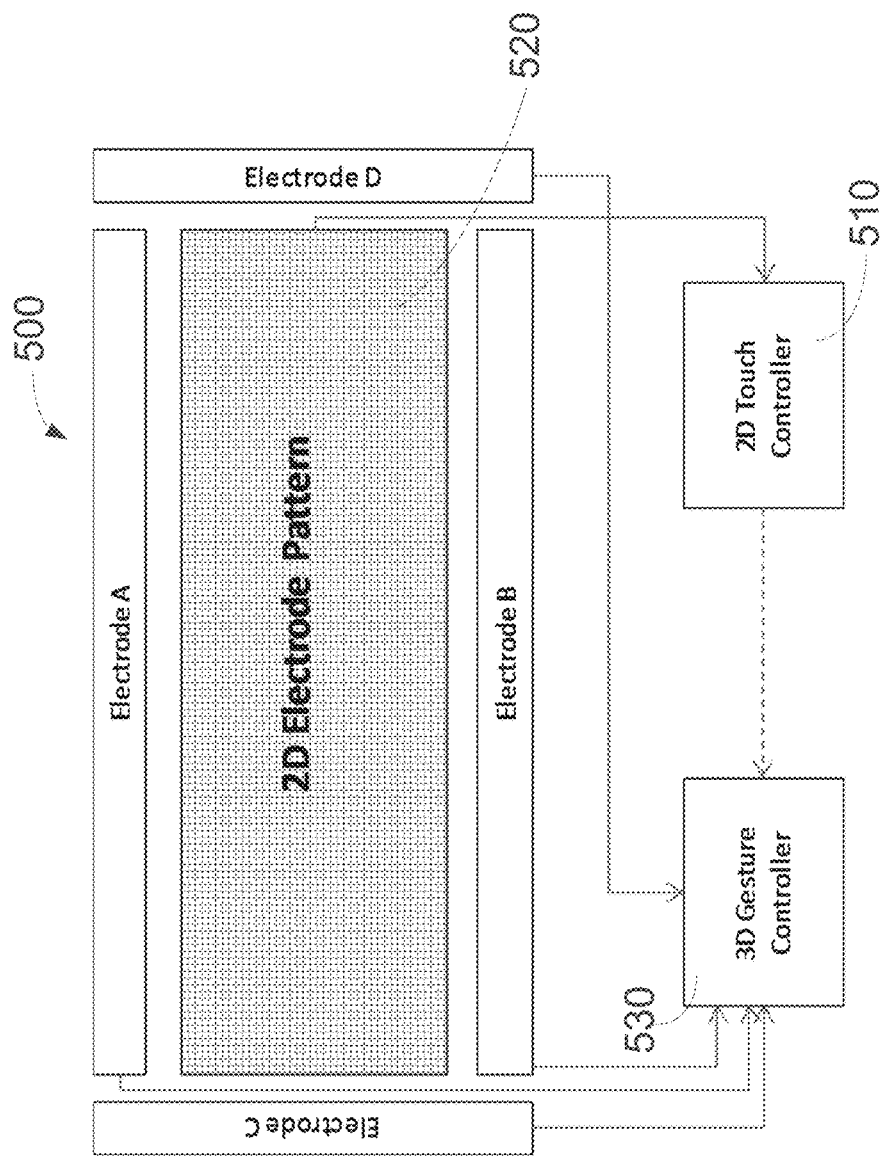
FIG. 5 shows a system with an external confidence generating controller.

FIG. 5 shows a system 500 with a 2D capacitive touch detection and finger tracking system, as it is for example used in touch panels or touch displays, consisting of number of sensor electrodes "2D Electrode Pattern" 520 and a controller unit "2D Touch Controller" 510. Around the 2D Electrode Pattern are arranged four further electrodes A, B, C, D used with a 3D Gesture Controller 530 to form a capacitive 3D gesture detection system. When the 2D touch detection system 510, 520 is active, it is interfering the received signals of the 3D gesture detection system, i.e. the received data of the 3D gesture detection system is noisy and unusable. In order to yield a functional 2D-3D capacitive sensor system 500, the 2D touch controller 510 is active only occasionally when no touch is detected, and while it is active, this is signaled to the 3D Gesture Controller 530 (dashed arrow), which then knows that its current received values are noisy and are associated Zero confidence. That is, the External Indicator can set $c_k=0$ when sample $x_k$ is generated while the 2D system 510, 520 was interfering the received signal, and $c_k=1$ else. $x_k$ and $c_k$ are input to the Digital Filter with Confidence Input within the 3D Gesture Controller 530.

An example for a simple peak-noise detector, or outlier detector, is the following: At each time k, compute the average $\mu_k := \sum_{i=1}^{M} x_{k-i}$ and the standard deviation $\sigma_k := \sqrt{\sum_{i=1}^{M}(x_{k-i}-\mu_k)^2}$ of the last M samples $x_{k-1}, x_{k-2}, \ldots, x_{k-M}$. If $|x_k| > \mu_k + 3 \cdot \sigma_k$, set $c_k=0$, else $c_k=1$.

1. Principal Approach

A standard digital finite input response (FIR) filter of order N is considered with time-invariant filter function $b=[b_0; b_1; \ldots; b_N]$, where $b_i$, $i=0, 1, \ldots, N$ are the filter coefficients. For a given input signal x with samples $x_k$, the filter output signal y is (1.1)

$$y_k = \sum_{i=0}^{N} b_i \cdot x_{k-i}, \quad (1.1)$$

wherein k is the discrete time index. The sum of all filter coefficients $b_i$ is the direct current (DC) filter gain. For simplicity and without loss of generality, in the following we assume $$\sum_{i=0}^{N} b_i = 1,$$

With each input sample $x_k$ we assume we are provided with an associated confidence value $c_k$. At first, we assume that the confidence value is binary with $c_k \in \{0; 1\}$, where $c_k=0$ means 'no confidence into sample $x_k$', and $c_k=1$ means 'full confidence'. From the time-invariant filter function b with coefficients $b_i$ we will compute time-variant filter function w(k) with coefficients $w_i(k)$ which depend on the confidence values $c_k$. When the latest N+1 input samples have all been with full confidence, i.e. $c_{k-i}=1$ for $i=0, N$, we desire that filter function w(k) is equal to function b. If, however, there is one or more Erasures, i.e. input samples $x_{k-i}$ with associated $c_{k-i}=0$, then $x_{k-i}$ must not contribute to the output value $y_k$.

This is achieved by multiplying each filter coefficient $b_i$ in (1.1) with the confidence value $c_{k-i}$ of its associated input sample $x_{k-i}$. However, with the modified filter coefficients $b_i'(k):=b_i \cdot c_{k-i}$, the DC filter gain $\Sigma_{i=0}^{N} b_i'(k)$ is no longer guaranteed to be constant.

Consequently, the erased filter weight must be distributed onto the other filter coefficients. The preferred approach to do so is to distribute the erased weight $$\sum_{j=0: c_{k-j}=0}^{N} b_j = \sum_{j=0}^{N} (1 - c_{k-j}) \cdot b_j$$

evenly onto the remaining $\Sigma_{j=0}^{N} c_{k-j}$ non-erased coefficients, which is yielding a linear time-variant (LTV) filter with coefficients $$w_i(k) := c_{k-i} \cdot b_i + \frac{c_{k-i}}{\sum_{j=0}^{N} c_{k-j}} \cdot \underbrace{\sum_{j=0}^{N} (1 - c_{k-j}) \cdot b_j}_{\text{erased weight}} \quad (1.2)$$

where $i \in \{0, 1, \ldots, N\}$, and we denote $$\frac{c_{k-i}}{\sum_{j=0}^{N} c_{k-j}}$$

the relative confidence associated to sample $x_{k-i}$ at time k.

This is equivalent to replacing the erased input samples by the average of the non-erased ones at each time instance k, and setting $c_{k-i}=1$ for all i. This way of implementation of the algorithm is particularly interesting for one-time, or 'block-wise' processing of each input sample like it is done with windowing and DC value computation in order to estimate the DC value of a finite set of consecutive samples.

$$\text{Proof: } y_k = \sum_{i=0}^{N} w_i \cdot x_{k-i}$$

$$= \sum_{i=0}^{N} x_{k-i} \cdot \left[ c_{k-i} \cdot b_i + \frac{c_{k-i}}{\sum_{j=0}^{N} c_{k-j}} \cdot \sum_{j=0}^{N} (1 - c_{k-j}) \cdot b_j \right]$$

$$= \sum_{i=0: c_{k-i}=1}^{N} x_{k-i} \cdot b_i + \sum_{i=0: c_{k-i}=1}^{N} x_{k-i} \cdot \frac{\sum_{j=0: c_{k-j}=0}^{N} b_j}{\sum_{i=0: c_{k-i}=1}^{N} 1}$$

$$= \sum_{i=0: c_{k-i}=1}^{N} b_i \cdot x_{k-i} + \sum_{i=0: c_{k-i}=0}^{N} b_i \cdot \underbrace{\frac{\sum_{j=0: c_{k-j}=1}^{N} x_{k-j}}{\sum_{i=0: c_{k-i}=1}^{N} 1}}_{\text{average of non-erased input}}.$$

As this procedure implies overwriting the input data, it is not applicable for continuous filtering, where each input sample contributes to multiple output samples, and calculating the output value is done at a rate higher than the input rate divided by the filter length, where we define the filter length as (N+1), i.e. filter order plus 1.

Figure 7:
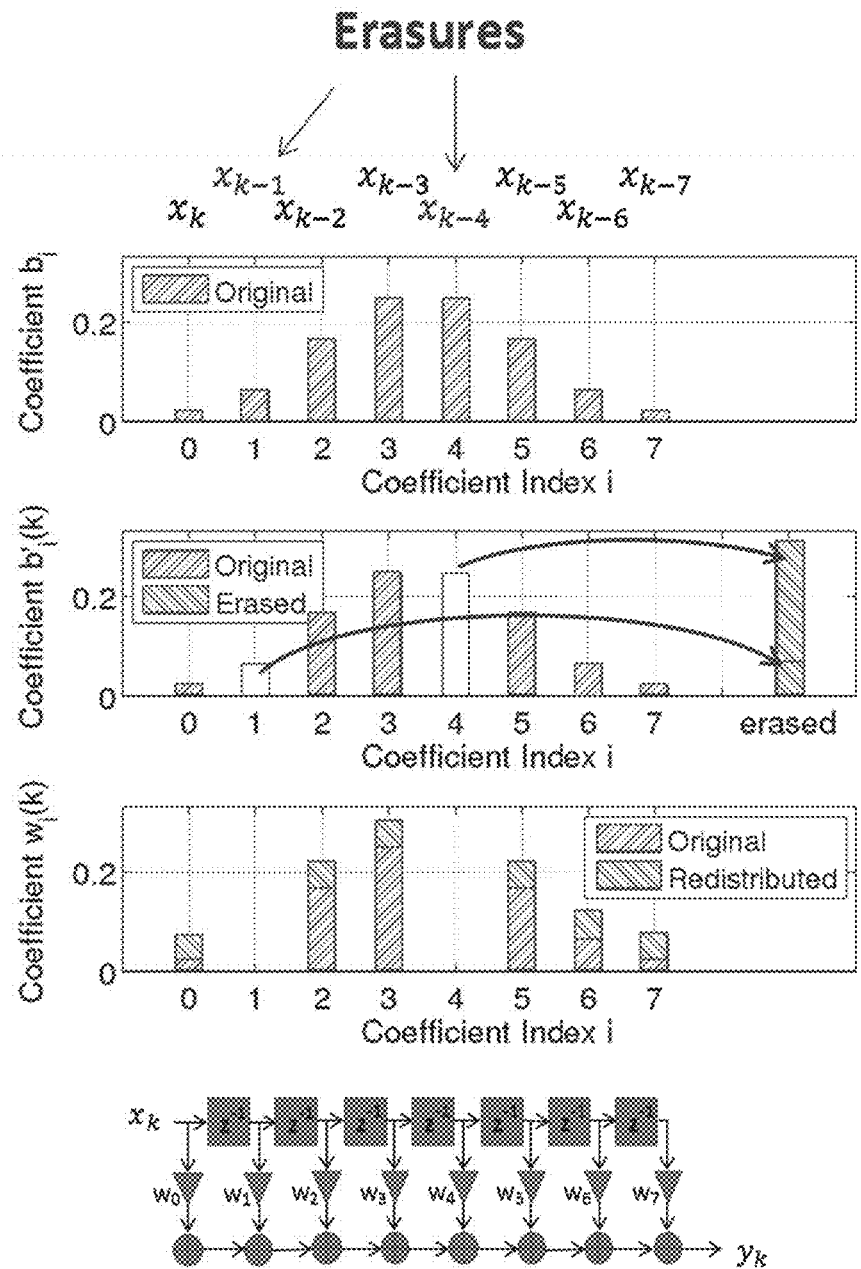
FIG. 7 shows an example of redistribution of erased coefficient weight according to various embodiments.

The re-distribution of erased filter coefficient weight is visualized in FIG. 7. In the very top, the latest 8 input samples at time k are shown, of which $x_{k-4}$ and $x_{k-1}$ are Erasures. The first plot shows the coefficients $b_i$ of the original filter—a Hamming window of length 8—aligned with the shift register implementation in the bottom. In the second plot, the values of the coefficients $b_1'(k)$ and $b_4'(k)$ are set to zero, as the corresponding input samples $x_{k-4}$ and $x_{k-1}$ at time k are Erasures. Also shown is the sum of the erased coefficients on the very right side of the second plot. In the third plot, the erased weight, as shown in the right of the second plot, is evenly redistributed onto the coefficients assigned to non-erased input samples, yielding $w_i(k)$. The added on weights are shown differently hatched in the third plot. The coefficient weights are shown in the bottom shift register filter diagram as $w_0$-$w_7$ in this embodiment.

With the next input sample at time k+1, the samples and their corresponding confidence information move to the right within the filter's shift register and said redistribution is done again for the shifted pattern of erasures yielding different filter coefficients $w_i(k+1)$.

Figure 8:
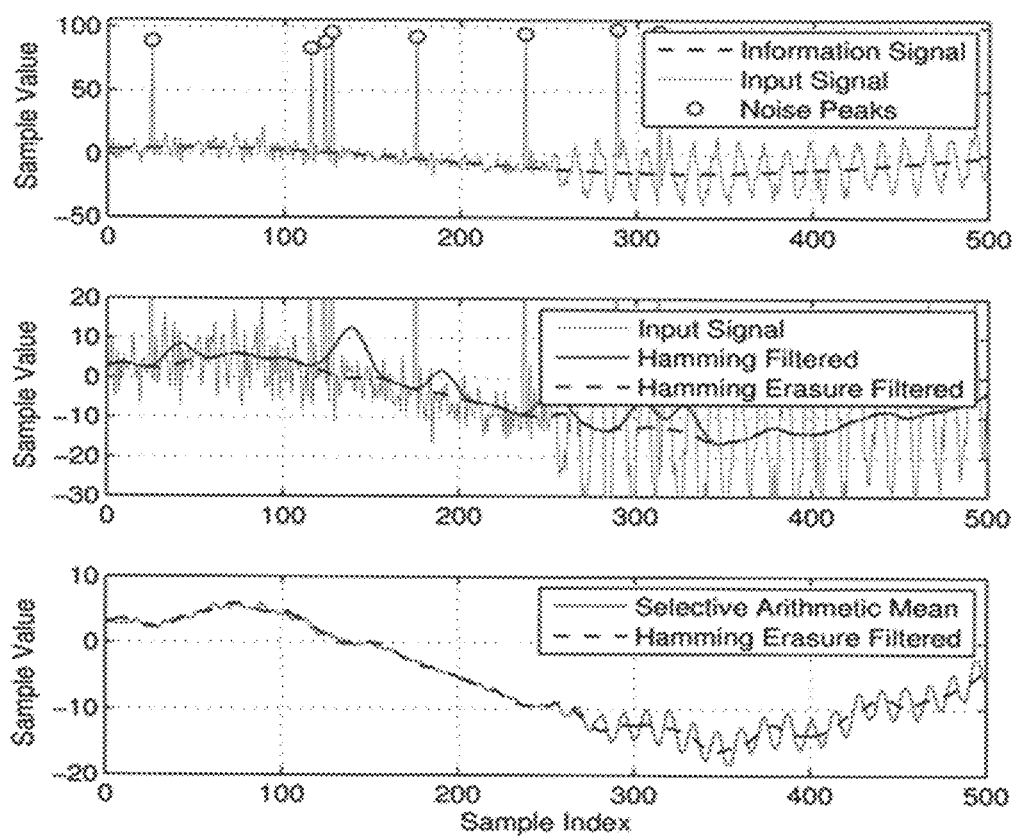
FIG. 8 shows an example of peak-noise suppression performance.

An example for the filter's noise suppression performance is shown in FIG. 8. The top plot shows the filter input signal, which is a slowly varying information signal with additive Gaussian noise, several noise peaks and—starting at sample index 250—with additive 60 Hz sinusoidal noise. The second plot shows that traditional low-pass filtering with a Hamming function of length 64 reduces the higher frequency noise, but only smears the noise peaks that are present in the input signal. However, having identified the noise peaks, they are suppressed completely according to various embodiments. The bottom plot of FIG. 8 demonstrates the benefit of using a Hamming Erasure filter function instead of Moving Average: Compared to simple averaging over non-peak samples, i.e. Selective Arithmetic Mean filtering, the Hamming Erasure filtering yields better suppression of the broad-band noise contained in the input signal, yielding a smoother output.

Figure 9:
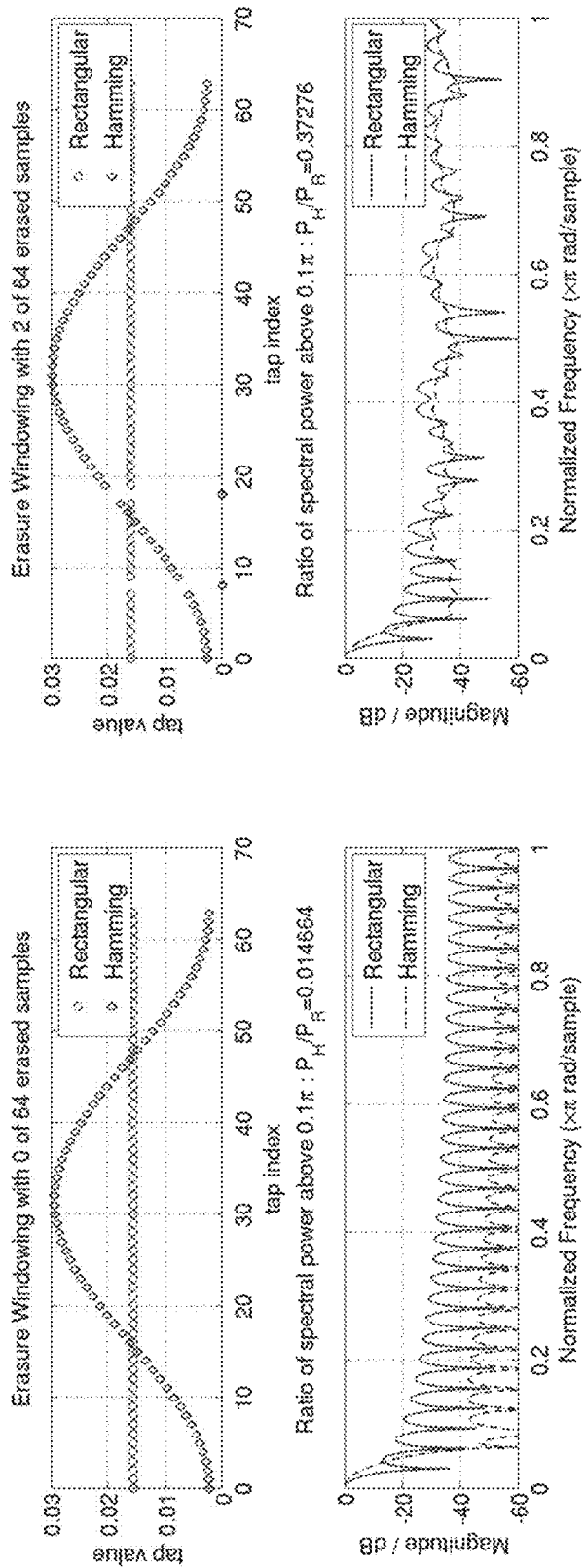
FIG. 9 shows a comparison of filters' coefficients and magnitude spectra with and without erasures.

FIG. 9 illustrates how Erasures affect the filter's frequency response. Here, the left side shows a typical low pass filter using a rectangular window and a Hamming window and its associated magnitude spectrum. On the right side the same filtering using two erased samples is shown. It can be observed that the spectrum of the Hamming Erasure filter is similar to the Rectangular erasure filter—depending on positions of Erasures.

2. Generalizations 2 a) Non-Binary Confidence Input

Up to this point, the confidence input was binary, i.e. the associated input sample was either used for computing the filter output value, or not. However, given above notation it is straight-forward to generalize the confidence input to take real values between 0 and 1, i.e. $c_k \in [0, 1]$, and the larger $c_k$, the more confident we are in the associated sample $x_k$. Apart from the definition of $c_k$, Equation (1.2) remains the same.

2b) General Redistribution Function

For binary confidence input, in Equation (1.2) the erased weight is evenly distributed onto the other coefficients. The two terms in (1.2) can be interpreted as two parallel filter branches whose output is summed-up. The filter function in the first term is computed from b and the confidence input, and the second term is a time-variant averaging filter. The latter can be generalized by introducing another FIR filter function g with coefficients $g_i$, yielding $$w_i(k) = c_{k-i} \cdot b_i + \frac{c_{k-i} \cdot g_i}{\sum_{j=0}^{N} c_{k-j} \cdot g_j} \cdot \sum_{j=0}^{N} (1 - c_{k-j}) \cdot b_j$$

$$w_i(k) = c_{k-i} \cdot \left( b_i + g_i \cdot \frac{\sum_{j=0}^{N} (1 - c_{k-j}) \cdot b_j}{\sum_{j=0}^{N} c_{k-j} \cdot g_j} \right)$$

which is also applicable with non-binary confidence input $c_k \in [0, 1]$. We denote as $$\frac{c_{k-i} \cdot g_i}{\sum_{j=0}^{N} c_{k-j} \cdot g_j}$$

the g-weighted relative confidence associated to sample $x_{k-i}$ at time k.

The filter output hence is given by $$y_k = \sum_{i=0}^{N} w_i(k) \cdot x_{k-i} = \sum_{i=0}^{N} x_{k-i} \cdot c_{k-i} \cdot \left( b_i + g_i \cdot \frac{\sum_{j=0}^{N} (1 - c_{k-j}) \cdot b_j}{\sum_{j=0}^{N} c_{k-j} \cdot g_j} \right).$$

A possible implementation of this filter is shown in FIG. 4, where the block denoted 'B' refers to a standard FIR filter with filter function b, and analog for the block denoted G' and filter function g, and the block denoted $$\frac{1}{x}$$

refers to the division of 1 by the block's input data, i.e. the output of this block is the multiplicative inverse (reciprocal) of the input. In this implementation, the filter coefficients of the four filter blocks ('B' and 'G') are constant. Of course, the filters 'B' and 'G' processing the same input data, i.e. $c_k$ or $q_k := x_k \cdot c_k$, can share the same buffer, as it is shown in the shift register implementation in FIG. 6 for filter order N=7, which highlights the delay lines both for the confidence-weighted input data values $q_k := x_k \cdot c_k$ and the confidence values $c_k$. Here, the adaptivity is contained in the filter blocks' input signals. Still, the implementation is equivalent to a single FIR filter with adaptive filter coefficients $w_i(k)$.

Figure 6:
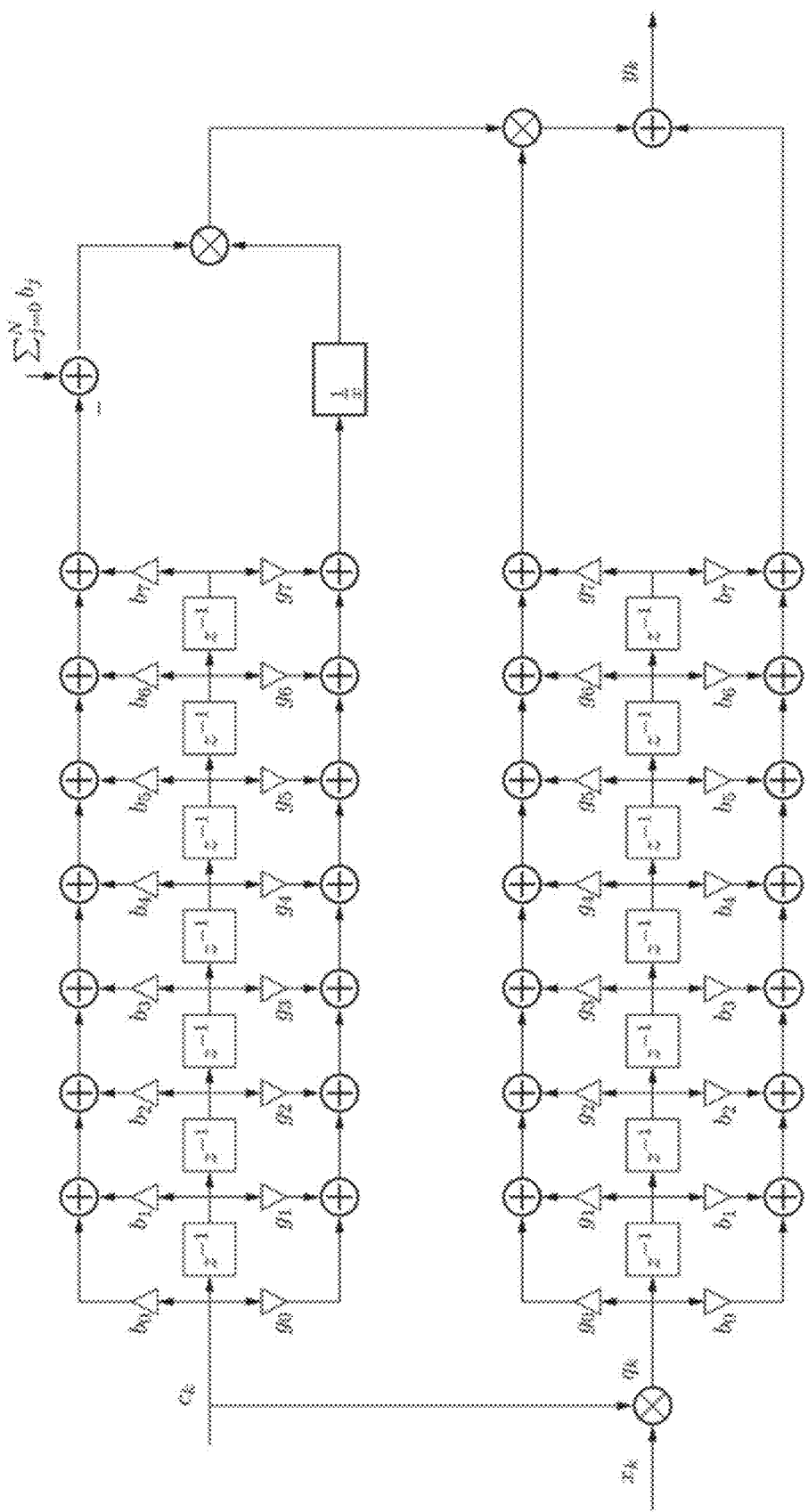
FIG. 6 shows an exemplary shift register implementation of a digital filter with confidence input.

A characteristic property of the tapped delay line implementation of the FIR filter in FIG. 6 is that the tapped delay lines for the confidence values TDL-C and the tapped delay line for confidence-weighted input data TDL-XC are identical, i.e. they have the same number of delay stages, and the same tap weights $b_0, b_1, \ldots$ and $g_0, g_1, \ldots$ are connected to the respective delay stages. Of course, one or the other delay line may be simplified depending on the input variable type, e.g. binary confidence input. Also, when $g_0 = g_1 = g_2 = \ldots$, the delay lines or associated computation blocks can be simplified. Further, it does not matter if the weights $b_0, b_1, \ldots$ in TDL-C differ from the weights $b_0, b_1, \ldots$ in TDL-XC by a constant factor, neither if the weights $g_0, g_1, \ldots$ in TDL-C differ from the weights $g_0, g_1, \ldots$ in TDL-XC by a constant factor, because such factors can be compensated for outside the tapped delay lines.

For example, if $g_i = 1/8$, the respective tap weights can also be set to 1, hence saving multiplications, and only the sum at the end of the tapped delay line before the (1/x) block is divided by 8, which can also be done by means of bit shift operations.

For binary confidence input, or confidence values from a finite set of values, the computation of the confidence-weighted input data values $q_k$ realized by the multiplication in FIG. 6 can also be realized by conditional statements, e.g. IF/ELSE or SWITCH statements, where for example $q_k$ is set to 0 if $c_k=0$, and $q_k$ is set to 1 if $c_k=1$. Instead of before the delay line, conditional statements can also be allocated at each tap of the delay line: A tap-weighted input value $b_i \cdot x_{k-i}$ or $g_i \cdot x_{k-i}$ is then only added to the respective delay line's output sum value if the associated $c_{k-i}$ is One. In this case, the samples $x_k$ can be directly input to TDL-XC and to not need to be multiplied with $c_k$ beforehand. The analog holds for TDL-C.

The order of the filters with impulse responses b and g do not necessarily have to be equal. Without loss of generality the filters are defined to have equal order N, where N is at least as large as the maximum of the orders of the filters with b and g, and unused coefficients are assumed to be zero-valued.

Choosing g=b is yielding another, non-preferred approach for redistributing erased coefficient weights. The non-erased filter coefficients are scaled by the same factor, which is re-computed at each discrete time instance k, i.e.

$$v_i(k) := c_{k-i} \cdot b_i \cdot \frac{1}{\sum_{j=0}^{N} c_{k-j} \cdot b_j}$$

3. Exception Handling

With the denominators in (1.2) or (1.3) it is apparent that an output value cannot be computed if the latest N+1 input samples all come along with Zero confidence. A possible exception for such a case is to repeat the latest valid output sample, or the exception can be forwarded to subsequent processing stages.

4. Windowing & DC Value Computation, in Particular for Signals with Two or More Expected Signal Levels For a symmetric filter or 'windowing' function b, taking a snapshot in time of the convolution of the input signal with the function b is equivalent to weighting the input samples with b and summing over the pointwise products. Hence, when interested in the DC value of a windowed signal, above concepts can equally be applied. A major difference between windowing with DC-computation and continuous filtering is that for the former typically each input sample contributes to only a single output value, i.e. it is a one-time processing—or block-wise—processing of input samples.

In many applications, the measurement signal is alternating between two distinct levels, typically with additional noise. We refer to these levels as 'high' and 'low' signal level. An example is amplitude modulation (AM) with synchronous sampling of the analog received signal at twice the carrier frequency, where the information is contained in the difference between the 'high' and 'low' signal level. This method is applied, for example, in capacitive touch detection systems, or GestIC® Technology. The measurement (or 'received') signal of such an AM sensor system can, for example, be demodulated by alternatingly multiplying it with +1 and −1, and then low-pass filtered in order to estimate the DC (zero-frequency) value—the actual information, the 'averaged' difference between the 'high' and 'low' samples.

Such a signal with two levels will now be considered, which in a standard application is input to a low-pass filter, wherein the nomenclature of 'high' and 'low' samples is kept denoting the set of samples corresponding to either of the two distinct signal levels. A deviation from their respective signal level will be assumed to be caused by noise.

When a 'low' sample is detected to be useless, e.g. due to detected peak noise, we would like to set the weight of its corresponding coefficient in the filter to Zero, and re-distribute the erased weight onto other coefficients. However, in order to maintain the filter output's expected value, the re-distribution must only be onto the coefficients assigned to the other 'low' samples. Else, the filter output would be closer to the 'high' level than it should be, as coefficients assigned to 'high' samples would get additional weight.

In general, an input signal's samples must be sorted into sets of samples with the same expected value, and the digital filtering with confidence input—i.e. the re-distribution of coefficient weight—must happen in such a way that the all-over weight of the coefficients assigned to each set remains constant, which is most easily accomplished when re-distributing weight erased in one set within the same set.

5. Confidence Output

The ability to process input confidence values immediately raises the question if also a confidence value can be provided for each output sample. Such an output confidence measure should be independent of the input sample values, but should be a function only of the input confidence values and the filter coefficients, i.e.

$$d_k = f(b_0, b_1, \ldots, b_N, c_k, c_{k-1}, \ldots, c_{k-M}) \quad (1.4)$$

for a positive integer M.

A measure that fulfills (1.4) and is readily available is the sum of the filter coefficients being weighted with their corresponding input confidence values, i.e.

$$d_k = \sum_{i=0}^{N} c_{k-i} \cdot b_i,$$

for which also holds $d_k \in [0, 1]$ provided that $b_i \geq 0$ for all i and $\sum_{i=0}^{N} b_i = 1$, and in particular $d_k = 1$ when all input samples have full confidence, and $d_k = 0$ when all input confidence values are $c_{k-i} = 0$.

Making use of such confidence output, multiple of the proposed filters can be cascaded. Also, this output can be used for high-level control, e.g. 'do not trigger touch event if output confidence is too low'.

7. Design Rules

The proposed approach is applicable to any low-pass FIR filter. However, all filter coefficients should have the same sign, e.g. be positive valued. Principally, the requirement of a constant DC filter gain can also be fulfilled when (some of the) tap weights are negative valued. However, this would introduce the risk of yielding undesired filter characteristics, e.g. high-pass characteristics, for some confidence input constellations.

Further, the more similar the filter coefficients values are, the less critical when the input samples assigned to coefficients with large values are erased. In particular, the coefficients of a Rectangular window, Triangular window, Hamming and Hann window are in compliance with these rules.

Apart from the choice of the original filter coefficients and the exception handling, there are no further parameters to consider.

Figure 10:
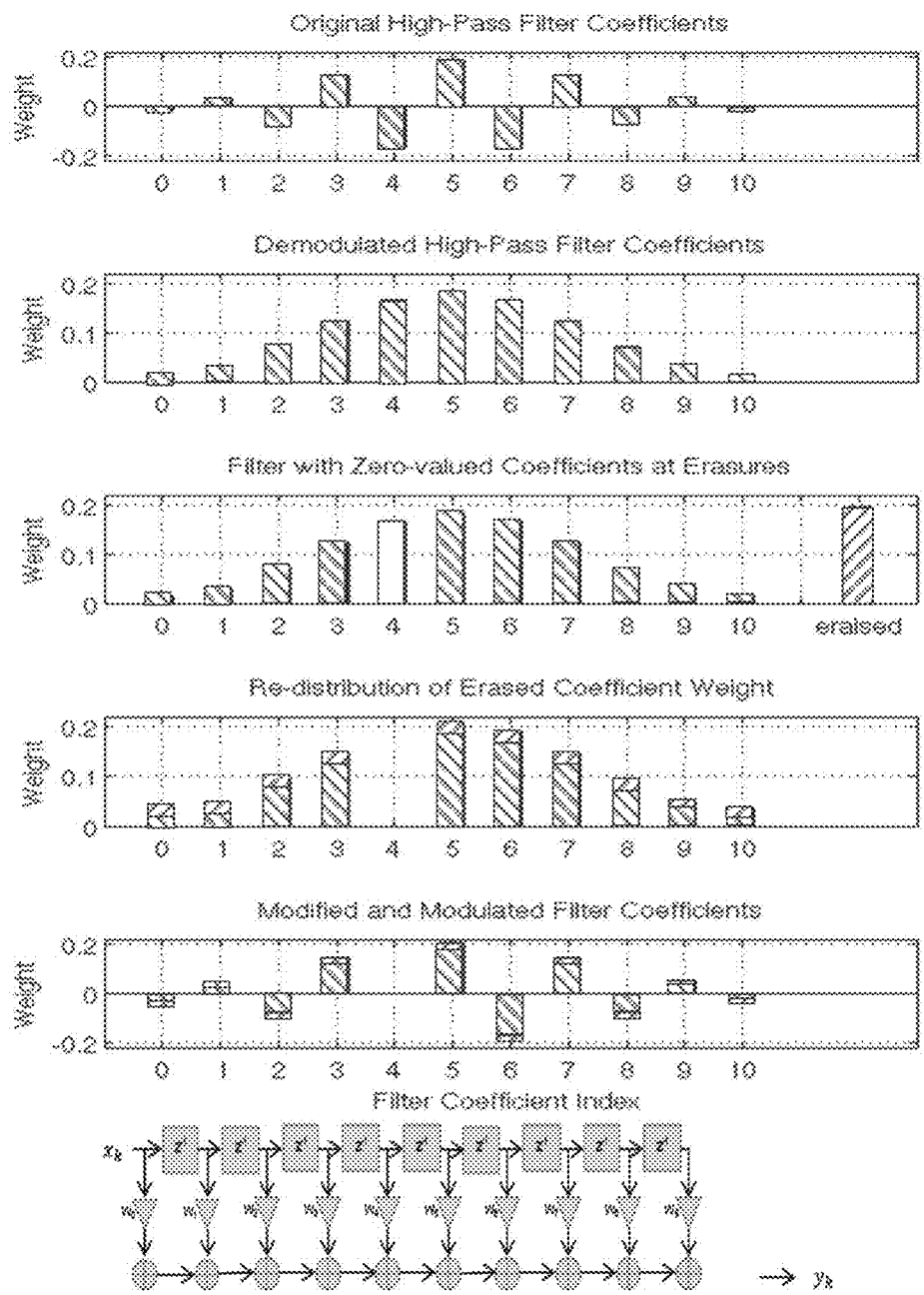
FIG. 10 shows an example of a redistribution of erased coefficient weight in a high pass filter embodiment.

The approach can be extended to high-pass filters. FIG. 10 shows an example of a high-pass filter whose original filter coefficient weights alternate between positive and negative sign as shown in the first plot from the top. Thus, according to an embodiment, first the high pass filter coefficients are demodulated using and alternating sign as shown in the second plot from the top. Then, the same method as with the low pass filter shown in FIG. 2 is applied as shown in the third and fourth plot from the top. The modified weights as shown in the fourth plot from the top are then re-modulated using the inverse alternating signs. This results in distributed weights as shown in the fifth plot from the top. Instead of remodulation of the filter coefficients, the filter's input signal can be demodulated, too, and filtered with the equivalent low-pass with coefficients according to the forth plot from the top, before modulating the signal again. No matter if the input signal is filtered with the high-pass filter directly, or demodulated and being filtered with the equivalent low-pass filter, it is important that the samples of the high pass filter's input signal—if it would be demodulated—would have a single expected value.

8. Applications & Use-Cases

As mentioned above, the proposed concept is applicable to any filtering system where the input signal is sampled faster than the actual information changes—the higher the sampling rate, the better. Among many others, such systems include 3D capacitive sensor systems, such as Assignees GestIC system and 1D/2D capacitive touch solutions. The filtering method may further more be applied to other sensor signals and is not restricted to capacitive sensor systems.

9. Properties

When initializing the filter with arbitrary, but zero-confidence, data, it provides an estimate of the input signal from turn-on time. Hence, the filter does not show the typical step response when filtering a signal with a non-zero mean and the filter conditions have been initialized with zeroes.

Numerical Example

In the following we give a numerical example for the computation of output values for the filter with confidence input. The tables below state the input sample values $x_k$ and the associated confidence values $c_k$ at time k, and the coefficients $b_i$ of the original filter function b. Here, g is a constant, i.e. erased coefficient weight will be redistributed uniformly.

| | | | | | | | | k | | | | | | | | | |
|---|---|---|---|---|---|---|---|---|---|---|---|---|---|---|---|---|---|
| | −7 | −6 | −5 | −4 | −3 | −2 | −1 | 0 | 1 | 2 | 3 | 4 | 5 | 6 | 7 | 8 | 9 | 10 |
| $x_k$ | 0 | 0 | 0 | 0 | 0 | 0 | 0 | 7 | 6 | 8 | 9 | 6 | 21 | 6 | 7 | 33 | 8 | 6 |
| $c_k$ | 0 | 0 | 0 | 0 | 0 | 0 | 0 | 1 | 1 | 1 | 1 | 1 | 0 | 1 | 1 | 0 | 1 | 1 |

| | | | | i | | | | |
|---|---|---|---|---|---|---|---|---|
| | 0 | 1 | 2 | 3 | 4 | 5 | 6 | 7 |
| $b_i$ | 0.0207 | 0.0656 | 0.1664 | 0.2473 | 0.2473 | 0.1664 | 0.0656 | 0.0207 |
| $g_i$ | 0.125 | 0.125 | 0.125 | 0.125 | 0.125 | 0.125 | 0.125 | 0.125 |

At times k=5 and k=8 there are Erasures, i.e. $c_5=c_8=0$. For example, the confidence has been set to zero here because the values $x_5$ and $x_8$ have been detected to be noise peaks.

For initialization of the filter, all confidence information within the filter's memory is set to zero before inputting the first sample-confidence pair $(x_0, c_0)$, e.g. by inputting N samples with zero confidence. This is indicated in the table by $c_k=0$ for k<0. At time k=0 the sample $x_0=7$ with confidence $c_0=1$ is input to the filter. According to above equations, the modified coefficients $b_i'(k=0)$ and the coefficients $w_i(k=0)$ compute as

| | | | | i | | | | |
|---|---|---|---|---|---|---|---|---|
| | 0 | 1 | 2 | 3 | 4 | 5 | 6 | 7 |
| $b_i'(0)$ | 0.0207 | 0 | 0 | 0 | 0 | 0 | 0 | 0 |
| $w_i(0)$ | 1 | 0 | 0 | 0 | 0 | 0 | 0 | 0 |

That is, $x_0=7$ is directly forwarded to the output, i.e. $y_0=x_0=7$.

At time k=9, when two Erasures, $x_5$ and $x_8$, are in the filter's buffer, $b_i'(k=9)$ and $w_i(k=9)$ compute as

| | | | | i | | | | |
|---|---|---|---|---|---|---|---|---|
| | 0 | 1 | 2 | 3 | 4 | 5 | 6 | 7 |
| $b_i'(9)$ | 0.0207 | 0 | 0.1664 | 0.2473 | 0 | 0.1664 | 0.0656 | 0.0207 |
| $w_i(9)$ | 0.0624 | 0 | 0.2081 | 0.2889 | 0 | 0.2081 | 0.1073 | 0.0624 |

BIBLIOGRAPHY

B. Boashash, M. M. (2004). Signal Enhancement by Time-Frequency Peak Filtering. *IEEE Transactions on Signals Processing*, 929-937.

Blahut, R. E. (1983). *Theory and Practice of Error Control Codes*. Reading, Mass.: Addison-Wesley.

Bossert, M. (1999). *Channel Coding for Telecommunication*. New York, N.Y., USA: John Wiley & Sons, Inc.

Commission, I. E. (n.d.). Electrical Fast Transient/Burst Immunity Test (IEC 61000-4-4).

Grubbs, F. E. (1950, March). Sample criteria for testing outlying observations. *Ann. Math. Statist., pp.* 27-58.

H. Hwang, R. H. (1995). Adaptive median filters: New algorithms and results. *IEEE Transactions on Image Processing*, 499-502.

Hampel, F. R. (1974). The influence curve and its role in robust estimation. *Journal of the American Statistical Association*, 69, 383-393.

J. Horentrup, M. S. (2014). Confidence-aware guided image filter. *IEEE International Conference on Image Processing*, (pp. 3243-3247).

K. Aiswarya, V. J. (2010). A new and efficient algorithm for the removal of high density salt and pepper noise in images and videos. *Second International Conference on Computer Modeling and Simulation*, (pp. 409-413).

Kalman, R. E. (1960). A new approach to linear filtering and prediction problems. *Transactions of the ASME-Journal of Basic Engineering*, 35-45.

Lee, J.-S. (1983). Digital image smoothing and the sigma filter. *Computer Vision, Graphics, and Image Processing*, 255-269.

Microchip Touch and Input Sensing Solutions. (n.d.). Retrieved from http://www.microchip.com/touchandinputsensing S.-J. Ko, Y. H. (1991). Center weighted median filters and their applications to image enhancement. *IEEE Transactions on Circuits and Systems*, 984-993.

T. Benazir, B. I. (2013). Removal of high and low density impulse noise from digital images using non linear filter. *International Conference on Signal Processing, Image Processing and Pattern Recognition*, (pp. 229-233).

The invention claimed is:

1. A circuit arrangement comprising a finite impulse response (FIR) digital filter comprising assigned filter coefficients storing filter coefficient weights, the circuit comprising:
   a data source configured to provide digital samples at discrete times;
   an external indicator generating an associated confidence value for each digital sample;

wherein the FIR digital filter comprises an input receiving said digital samples, another input receiving said associated confidence values, and a filter output, and the FIR digital filter is configured to apply a digital filter function on said digital samples using said filter coefficients;

wherein the FIR digital filter is further configured to modify or eliminate some of the filter coefficient weights depending on the confidence values associated to their corresponding digital samples and to determine a sum of the filter coefficient weights that have been removed or partially removed and to redistribute the sum of the removed filter coefficient weights onto the filter coefficients.

2. The circuit arrangement according to claim 1, wherein the filter function is a low-pass filter function.

3. The circuit arrangement according to claim 2, wherein the low-pass filter function has been obtained from transforming a high-pass or band-pass to an equivalent low-pass domain.

4. The circuit arrangement according to claim 1, wherein the FIR filter comprises means for buffering the digital samples or the digital samples weighted by the associated confidence value, and the associated confidence values.

5. The circuit arrangement according to claim 4, wherein the filter comprises a buffer for the digital samples or the digital samples weighted by the associated confidence value, and a buffer for the associated confidence values.

6. The circuit arrangement according to claim 1, wherein the external indicator is a peak noise detector.

7. The circuit arrangement according to claim 1, wherein the sum of the removed filter coefficient weights is equally redistributed onto filter coefficients from which no weight has been removed.

8. The circuit arrangement according to claim 1, wherein a signal to be sampled comprises modulated values.

9. The circuit arrangement according to claim 1, wherein the values comprise at least two groups of values and wherein a partial aggregated removed coefficient weight associated with one group is only redistributed onto filter coefficients associated with the same group.

10. The circuit arrangement according to claim 1, wherein an aggregated removed coefficient weight is redistributed by adding to each filer coefficient a portion of the aggregated removed coefficient weight, the portion being a quotient of a confidence value corresponding to this filter coefficient and a sum of confidence values.

11. The circuit arrangement according to claim 6, wherein the sum of the removed coefficient weights is distributed onto filter coefficients such that the sum scaled by a g-weighted relative confidence associated to its corresponding digital sample is added to each remaining filter coefficient.

12. The circuit arrangement according to claim 11, wherein the g-weighted relative confidence is a relative confidence.

13. The circuit arrangement according to claim 1, further comprising a capacitive sensing system comprising capacitive sensors, wherein the data source is sampling analog signals provided by at least one of the capacitive sensors.

14. The circuit arrangement according to claim 9, wherein the FIR filter comprises only positive valued coefficients in one group and only negative valued coefficients in the other group.

15. The circuit arrangement according to claim 1, wherein the FIR filter comprises at least one non-zero valued coefficient with a different magnitude than another non-zero coefficients.

16. The circuit arrangement according to claim 1, wherein an digital sample associated with Zero-valued confidence input does not contribute to the filter output.

17. The circuit arrangement according to claim 1, wherein reducing a confidence input reduces the contribution of the associated digital sample to the filter output.

18. The circuit arrangement according to claim 17, wherein reducing a confidence input reduces the contribution of the associated digital sample to the filter output and increases the contribution of one or more of the other digital samples to the filter output.

19. The circuit arrangement according to claim 1, wherein the rate of calculating the filter output value is higher than the input rate divided by the length of the assigned filter.

20. The circuit arrangement according to claim 1, wherein a FIR digital filter's DC gain is constant.

21. The circuit arrangement according to claim 1, wherein the confidence values are binary.

22. The circuit arrangement according to claim 21, wherein the FIR digital filter is configured to determine whether at each discrete time step a filter coefficient assigned to a digital sample associated with the value of the binary confidence value is set to zero, and the sum of the coefficients to be set to zero is distributed onto remaining coefficients.

23. The circuit arrangement according to claim 22, wherein the sum is distributed evenly onto the remaining coefficients.

24. The circuit arrangement according to claim 21, wherein the FIR digital filter is configured to determine whether at each discrete time step a filter coefficient assigned to an digital sample associated with the binary confidence value is set to zero, and wherein the FIR digital filter is further configured to multiply each remaining non-zero filter coefficient weights with the sum of the original filter coefficient weights divided by the sum of the coefficients to be set to zero.

25. The circuit arrangement according to claim 1, wherein the confidence values are non-binary.

26. The circuit arrangement according to claim 25, wherein larger value of the confidence values indicate a higher confidence into the associated input value.

27. The circuit arrangement according to claim 1, wherein the filter output depends on linearly transformed confidence input values being filtered by the FIR digital filter.

28. The circuit arrangement according to claim 5, wherein the buffer for the confidence values is initialized with Zero confidence.

29. The circuit arrangement according to claim 1, comprising:

a first tapped delay line receiving the input confidence values and generating a first and second output value using first and second coefficients, wherein the first output value is generated by subtracting a first coefficient weighted output sum of the first tapped delay line from a sum of the first coefficients and the second output value is generated by computing the multiplicative inverse of a second coefficient weighted output sum, wherein first and second output values are multiplied to form a first tapped delay line output value;

a second tapped delay line receiving the sample values multiplied by associated confidence values and generating a third and fourth output value using third and fourth coefficients, wherein the third output value is generated by multiplying a third coefficient weighted output sum of the second tapped delay line with the first tapped delay line output value, and wherein values for the filter output are generated by adding the third and fourth output values.

30. The circuit arrangement according to claim 29, wherein the first tapped delay line and the second tapped delay line are formed identically.

31. The circuit arrangement according to claim 29, wherein the first and fourth coefficients are identical and wherein the second and third coefficients are identical.

32. The circuit arrangement according to claim 29, wherein all coefficients of the set of second coefficients and of the set of third coefficients have the same value.

33. The circuit arrangement according to claim 21, wherein the FIR digital filter is configured to determine whether at each discrete time step a weight of a filter coefficient assigned to a digital sample associated with the value of the binary confidence value is entirely removed, and the sum of the entirely removed coefficients is distributed onto the remaining set of coefficients.

34. A circuit arrangement, comprising:
a first digital circuit receiving first input values comprising a first tapped delay line generating a first and second output value using first and second coefficients, a subtractor configured to subtract the first output value from a sum of the first coefficients, an inverter configured to generate a multiplicative inverse of the second output value, and a first multiplier configured to multiply outputs values from the subtractor and the inverter to form a first digital circuit output value;
a second digital circuit comprising a second tapped delay line receiving second input values from a second multiplier configured to multiply said first and second input values and generating a third and fourth output value using third and fourth coefficients, a third multiplier configured to multiply the third output value with the first digital circuit output value, and a third adder configured to add the fourth output value and an output of the third multiplier,
wherein each tapped delay line comprises
a plurality of register cells coupled in series, each cell having an input and an output configured to receive respective input values,
a plurality of first and second adders, wherein the first adders are coupled in series and wherein the second adders are coupled in series, a plurality of first and second coefficient weights configured for weighting input values for the first or second adders, wherein a first of said plurality of first and second adders comprises an input coupled with the input and output of an associated cell through associated coefficient weights, respectively and inputs of remaining first and second adders are being coupled with a respective output of a preceding first or second adder and through associated coefficient weights with the output of an associated cell, respectively, wherein a last first adder provides for said first or third output value and a last second adder provides for said second or fourth output value, respectively,
wherein said second input values are input samples and said first input values are confidence values associated with each input sample and wherein the first and second coefficient weights comprise said first and second or said third and fourth coefficients.

35. The circuit arrangement according to claim 34, wherein the first and fourth coefficients are identical and wherein the second and third coefficients are identical.

36. The circuit arrangement according to claim 34, wherein all coefficients of the set of second coefficients and of the set of third coefficients have the same value.

* * * * *

UNITED STATES PATENT AND TRADEMARK OFFICE
CERTIFICATE OF CORRECTION

PATENT NO. : 10,135,424 B2
APPLICATION NO. : 15/053722
DATED : November 20, 2018
INVENTOR(S) : Axel Heim et al.

Page 1 of 1

It is certified that error appears in the above-identified patent and that said Letters Patent is hereby corrected as shown below:

In the Claims

<u>Column 15,</u>
Claim 10, Line 46, "...adding to each filer coefficient weight is redistributed by..." ---Change to---
"...adding to each filter coefficient weight is redistributed by..."

Signed and Sealed this
First Day of January, 2019

Andrei Iancu
*Director of the United States Patent and Trademark Office*